(12) United States Patent
Kim et al.

(10) Patent No.: US 11,437,352 B2
(45) Date of Patent: Sep. 6, 2022

(54) DISPLAY DEVICE USING SEMICONDUCTOR LIGHT-EMITTING ELEMENT

(71) Applicant: LG ELECTRONICS INC., Seoul (KR)

(72) Inventors: Junghoon Kim, Seoul (KR); Dohee Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/254,656

(22) PCT Filed: Jul. 5, 2018

(86) PCT No.: PCT/KR2018/007639
§ 371 (c)(1),
(2) Date: Dec. 21, 2020

(87) PCT Pub. No.: WO2019/245098
PCT Pub. Date: Dec. 26, 2019

(65) Prior Publication Data
US 2021/0272936 A1    Sep. 2, 2021

(30) Foreign Application Priority Data

Jun. 22, 2018  (KR) .......................... 10-2018-0072308

(51) Int. Cl.
*H01L 25/075*   (2006.01)
*H01L 33/00*    (2010.01)
(Continued)

(52) U.S. Cl.
CPC ...... *H01L 25/0753* (2013.01); *H01L 21/6835* (2013.01); *H01L 33/0093* (2020.05);
(Continued)

(58) Field of Classification Search
CPC ............ H01L 25/0753; H01L 21/6835; H01L 33/0093; H01L 33/62; H01L 2221/68354;
(Continued)

(56) References Cited

U.S. PATENT DOCUMENTS 10,546,842 B2 *   1/2020   Hu ......................... H01L 33/62
2007/0231826 A1  10/2007   Huber et al.
(Continued)

FOREIGN PATENT DOCUMENTS

KR   10-2007-0096212 A   10/2007
KR   10-2008-0056388 A    6/2008
(Continued)

*Primary Examiner* — Vu A Vu
(74) *Attorney, Agent, or Firm* — Birch, Stewart, Kolasch & Birch, LLP

(57) ABSTRACT

Discussed are a display device, and a method of manufacturing the display device. The display device includes a substrate having a plurality of metal pads, and a semiconductor light-emitting element electrically connected to the plurality of metal pads through self-assembly. Specifically, each metal pad includes a bonding metal electrically connected to a conductive electrode of a respective semiconductor light-emitting element, and a coating layer encompassing the bonding metal.

18 Claims, 13 Drawing Sheets

(51) Int. Cl.
  *H01L 21/683* (2006.01)
  *H01L 33/62* (2010.01)
(52) U.S. Cl.
  CPC .... *H01L 33/62* (2013.01); *H01L 2221/68354* (2013.01); *H01L 2221/68368* (2013.01); *H01L 2933/0066* (2013.01)
(58) Field of Classification Search
  CPC ... H01L 2221/68368; H01L 2933/0066; H01L 27/156; H01L 2221/68318; H01L 33/44; H01L 33/40; H01L 2221/68381; H01L 33/005
  USPC .......................................................... 257/89
  See application file for complete search history.

(56) References Cited

U.S. PATENT DOCUMENTS

2008/0023435 A1     1/2008  Wu et al.
2016/0163940 A1*    6/2016  Huang .................... H01L 33/62
                                                       257/89

FOREIGN PATENT DOCUMENTS

| KR | 10-2010-0111831 A | 10/2010 |
| KR | 10-2015-0046162 A | 4/2015 |
| KR | 10-2015-0104053 A | 9/2015 |

* cited by examiner (a)

(b)

(c)

DISPLAY DEVICE USING SEMICONDUCTOR LIGHT-EMITTING ELEMENT

CROSS-REFERENCE TO RELATED APPLICATIONS

This application is the National Stage filing under 35 U.S.C. 371 of International Application No. PCT/KR2018/007639, filed on Jul. 5, 2018, which claims the benefit of earlier filing date and right of priority to Korean Application No. 10-2018-0072308, filed on Jun. 22, 2018, the contents of all these applications are hereby incorporated by reference herein in their entirety.

BACKGROUND

1. Technical Field

The present disclosure relates to a display device and a manufacturing method thereof, and more particularly, to a flexible display device using a semiconductor light-emitting element.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known semiconductor light-emitting elements for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting elements may be used to implement a flexible display, thereby presenting a scheme for solving the problems.

As described above, in case of a display using semiconductor light-emitting elements, it is difficult to implement a large-sized display device. Therefore, in recent years, a manufacturing method in which semiconductor light-emitting elements are bonded to a substrate in a self-assembly manner has been developed. However, the self-assembly method in the related art is performed in an aqueous solution, and there is a problem that the loss of bonding metal that forms a bond between a substrate and a semiconductor light-emitting element occurs due to the aqueous solution in which self-assembly is performed.

Accordingly, when the semiconductor light-emitting element is bonded to the substrate in a self-assembly manner, a display device capable of preventing the loss of bonding metal may be taken in to consideration.

SUMMARY

An aspect of the present disclosure is to provide a structure capable of minimizing the loss of bonding metal during the self-assembly of a semiconductor light-emitting element in a display device, and to provide a method of manufacturing a semiconductor light-emitting element capable of minimizing the loss of bonding metal disposed on a substrate of a display device.

A display device according to the present disclosure may include a substrate having a plurality of metal pads; and a semiconductor light-emitting element electrically connected to the metal pads through self-assembly. Specifically, the metal pad may include a bonding metal electrically connected a conductive electrode of the semiconductor light-emitting element; and a coating layer surrounding the bonding metal.

According to an embodiment, the bonding metal may include at least one of copper (Cu), silver (Ag), indium (In), tin (Sn), and bismuth (Bi).

According to an embodiment, the coating layer may be formed of an amphiphilic organic material.

According to an embodiment, the coating layer may be formed of oleic acid.

According to an embodiment, a hydrophilic portion of the amphiphilic organic material may form an electrostatic bond with a natural oxide layer of the bonding metal to form a coating layer.

According to an embodiment, a method of manufacturing the display device may include growing a semiconductor light-emitting element on a growth substrate; separating the semiconductor light-emitting element from the growth substrate, and fixing the semiconductor light-emitting element to a temporary substrate; separating the semiconductor light-emitting element from the temporary substrate in a fluid-filled chamber; and coupling the semiconductor light-emitting element to a substrate on which a plurality of metal pads are formed through self-assembly in the fluid-filled chamber. Moreover, said forming a metal pad on the substrate may include forming a metal layer on the substrate to form ohmic contact with the semiconductor light-emitting element; forming a bonding metal electrically connected to a conductive electrode of the semiconductor light-emitting element on the substrate; and forming a coating layer surrounding the bonding metal to form the metal pad.

According to an embodiment, the method may include forming a sacrificial layer formed to surround the semiconductor light-emitting element between growing the semiconductor light-emitting element on the growth substrate and separating the semiconductor light-emitting element therefrom, wherein the sacrificial layer is a layer removed by a wet etching process.

According to an embodiment, in said separating the semiconductor light-emitting element, the sacrificial layer may be wet etched in a fluid, and the semiconductor light-emitting element may be separated from the temporary substrate.

According to an embodiment, in said forming a coating layer surrounding the bonding metal, the coating layer surrounding the bonding metal may be formed of an amphiphilic organic material, and the substrate on which the bonding metal is formed may be immersed in a solution of a predetermined concentration containing the amphiphilic organic material to self-align the amphiphilic organic material on a surface of the bonding metal, and a hydrophilic portion of the amphiphilic organic material may form an electrostatic bond with a natural oxide layer of the bonding metal to form a coating layer.

According to an embodiment, in said coupling the semiconductor light-emitting element to a substrate on which a metal pad is formed, a metal pad on which the coating layer is formed and the semiconductor light-emitting element may be allowed to collide with each other in a fluid to be coupled to the semiconductor light-emitting element as the coating layer is pushed to an outer edge of the bonding metal due to a surface tension of the coating layer.

According to an embodiment, said forming a coating layer surrounding the bonding metal and said coupling the semiconductor light-emitting element to a substrate on which the metal pad is formed may be performed a plurality of times.

In a display device according to the present disclosure, a coating layer that coats a bonding metal may be provided to prevent the loss of bonding metal by an aqueous solution in which self-assembly is performed, thereby having an effect of improving the assembly rate of semiconductor light-emitting elements even when repeated assembly is performed.

DETAILED DESCRIPTION OF THE EMBODIMENTS

Figure 1:
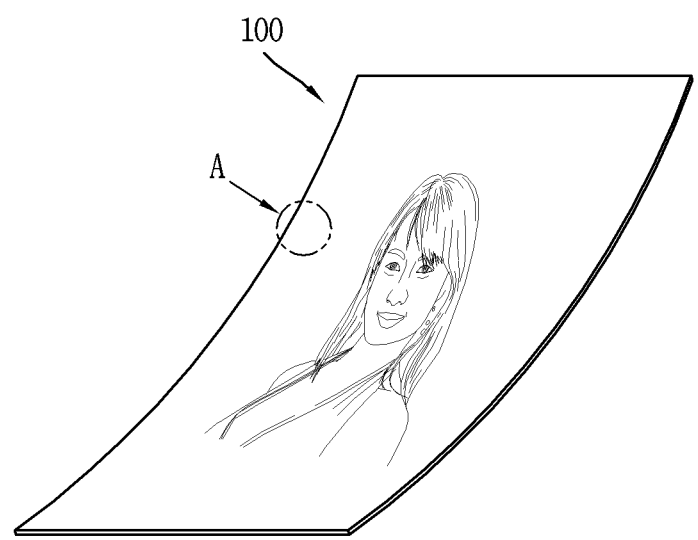
FIG. 1 is a conceptual view showing a display device using a semiconductor light-emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display device using a semiconductor light-emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light-emitting element. According to the present disclosure, a light emitting diode (LED) is illustrated as a type of semiconductor light-emitting element. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
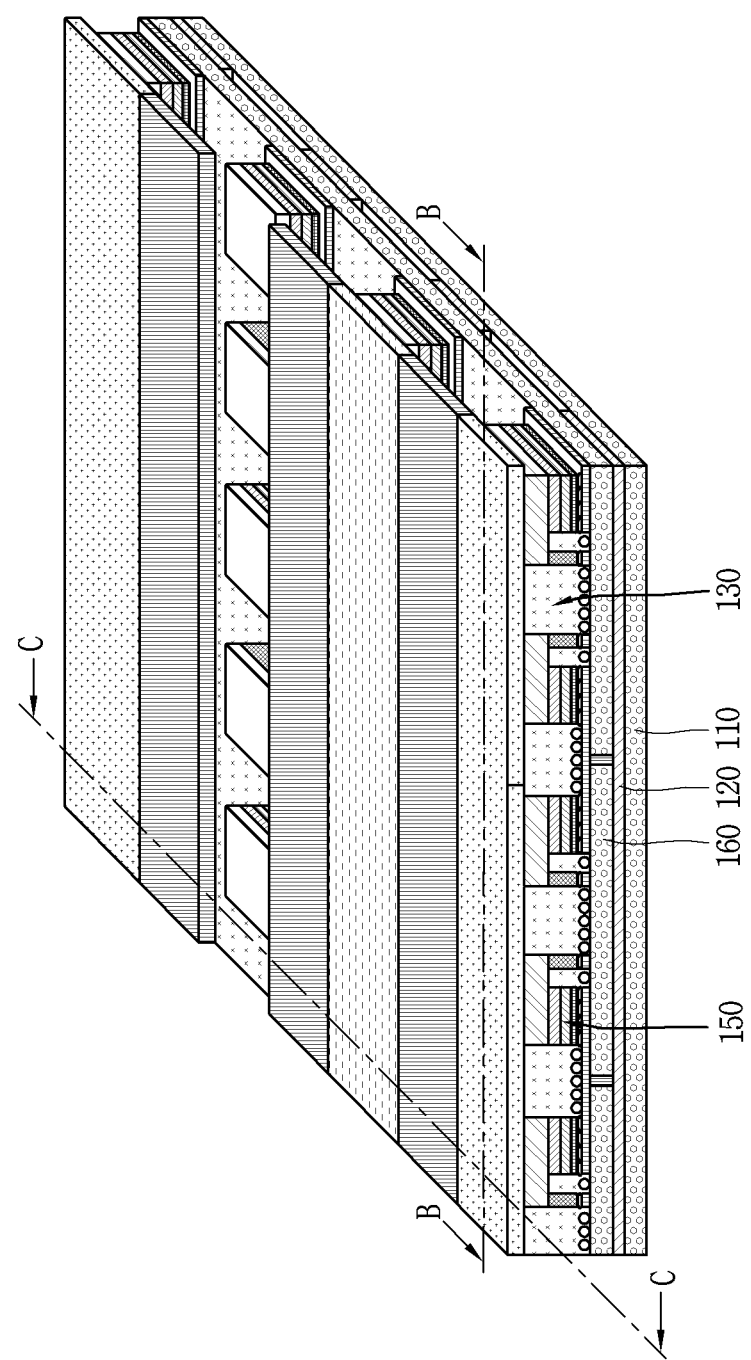
FIG. 2 is a partial enlarged view of portion "A" in FIG. 1, and FIGS. 3A and 3B are cross-sectional views taken along lines B-B and C-C in FIG. 2.
Figure 3A:
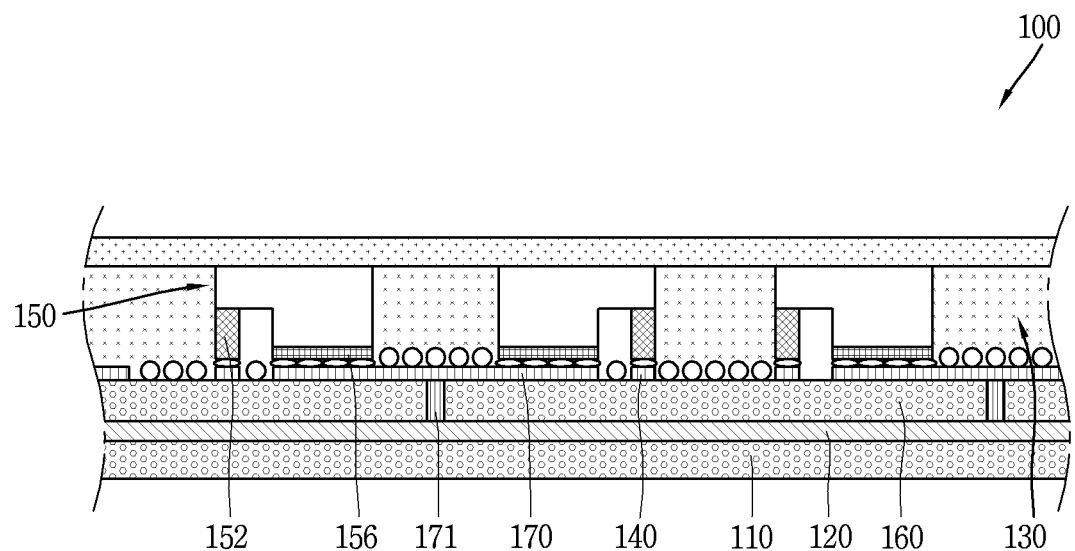
Figure 3B:
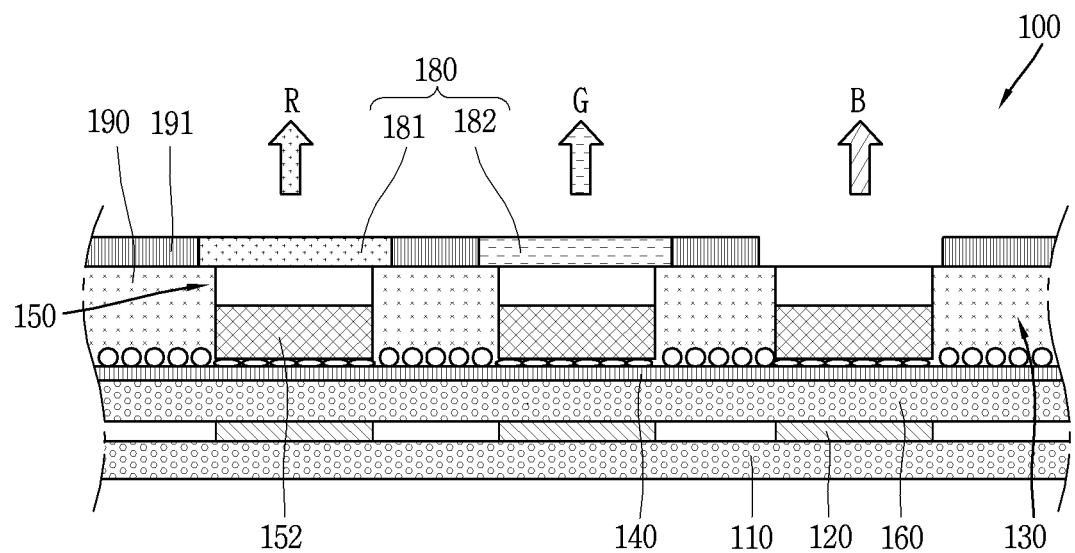
Figure 4:
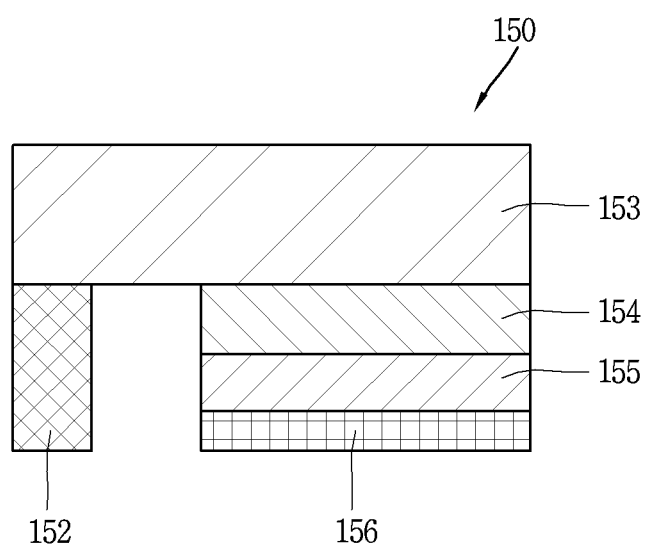
FIG. 4 is a conceptual view showing a flip-chip type semiconductor light-emitting element in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting element in FIG. 3A, and FIGS. 5A through 5C are conceptual views illustrating various forms for implementing colors in connection with a flip-chip type semiconductor light-emitting element.

According to the drawings in FIGS. 2, 3A and 3B, there is illustrated a display device 100 using a passive matrix (PM) type semiconductor light-emitting element as a display device 100 using a semiconductor light-emitting element.

However, an example described below may also be applicable to an active matrix (AM) type semiconductor light-emitting element.

The display device 100 may include a substrate 110, a first electrode 120, a conductive adhesive layer 130, a second electrode 140, and a plurality of semiconductor light-emitting elements 150.

The substrate 110 may be a flexible substrate. The substrate 110 may contain glass or polyimide (PI) to implement the flexible display device. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light-emitting element 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting element 150 is connect thereto in a flip chip form with the application of heat and pressure, the semiconductor light-emitting element 150 is electrically connected to the first electrode 120 and second electrode 140.

Referring to FIG. 4, the semiconductor light-emitting element may be a flip chip type semiconductor light-emitting element.

For example, the semiconductor light-emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting elements 150. For example, the left and right p-type electrodes of the semiconductor light-emitting elements around the auxiliary electrode may be electrically connected to one auxiliary electrode.

More specifically, the semiconductor light-emitting element 150 is pressed into the conductive adhesive layer 130, and through this, only a portion between the p-type electrode 156 and auxiliary electrode 170 of the semiconductor light-emitting element 150 and a portion between the n-type electrode 152 and second electrode 140 of the semiconductor light-emitting element 150 have conductivity, and the remaining portion does not have conductivity since there is no push-down of the semiconductor light-emitting element. As described above, the conductive adhesive layer 130 may form an electrical connection as well as allow a mutual coupling between the semiconductor light-emitting element 150 and the auxiliary electrode 170 and between the semiconductor light-emitting element 150 and the second electrode 140.

Furthermore, a plurality of semiconductor light-emitting elements 150 constitute a light-emitting array, and a phosphor layer 180 is formed on the light-emitting array.

The light-emitting element array may include a plurality of semiconductor light-emitting elements with different self-luminance values. Each of the semiconductor light-emitting elements 150 constitutes a sub-pixel, and is electrically connected to the first electrode 120. For example, there may exist a plurality of first electrodes 120, and the semiconductor light-emitting elements are arranged in several rows, for instance, and each row of the semiconductor light-emitting elements may be electrically connected to any one of the plurality of first electrodes.

Furthermore, the semiconductor light-emitting elements may be connected in a flip chip form, and thus semiconductor light-emitting elements grown on a transparent dielectric substrate. Furthermore, the semiconductor light-emitting elements may be nitride semiconductor light-emitting elements, for instance. The semiconductor light-emitting element 150 may have excellent luminance characteristics, and thus it may be possible to configure individual sub-pixels even with a small size thereof.

According to the drawing, a partition wall 190 may be formed between the semiconductor light-emitting elements 150. The semiconductor light-emitting element 150 may have excellent luminance characteristics, and thus it may be possible to configure individual sub-pixels even with a small size thereof. For example, a base member of the anisotropic conductive film may form the partition wall when the semiconductor light-emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light-emitting element 150. For example, the semiconductor light-emitting element 150 is a blue semiconductor light-emitting element that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting element 151 at a position implementing a red sub-pixel, and a green phosphor 182 capable of converting blue light into green (G) light may be deposited on the blue semiconductor light-emitting element 151 at a position implementing a green sub-pixel. Furthermore, only the blue semiconductor light-emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting element 150 may be combined with quantum dot (QD) instead of phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
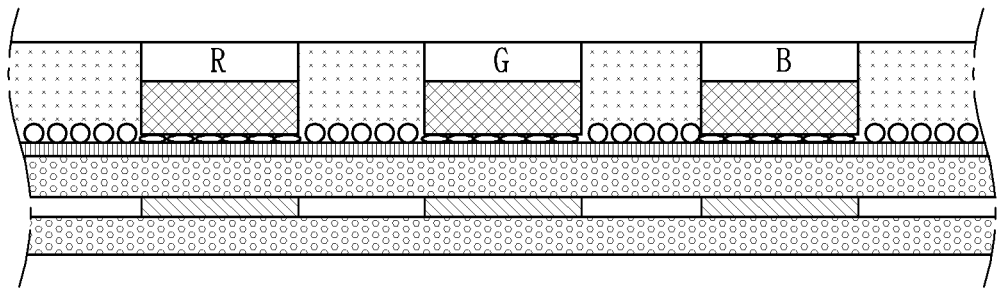
FIGS. 5A through 5C are conceptual views illustrating various forms for implementing colors in connection with a flip-chip type semiconductor light-emitting element.

Referring to FIG. 5A, each of the semiconductor light-emitting elements 150 may be implemented with a high-power light-emitting element that emits various lights including blue in which gallium nitride (GaN) is mostly used, and indium (In) and or aluminum (Al) are added thereto.

In this case, the semiconductor light-emitting element 150 may be red, green and blue semiconductor light-emitting elements, respectively, to implement each sub-pixel. For instance, red, green and blue semiconductor light-emitting elements (R, G, B) are alternately disposed, and red, green and blue sub-pixels implement one pixel by means of the red, green and blue semiconductor light-emitting elements, thereby implementing a full color display.

Figure 5B:
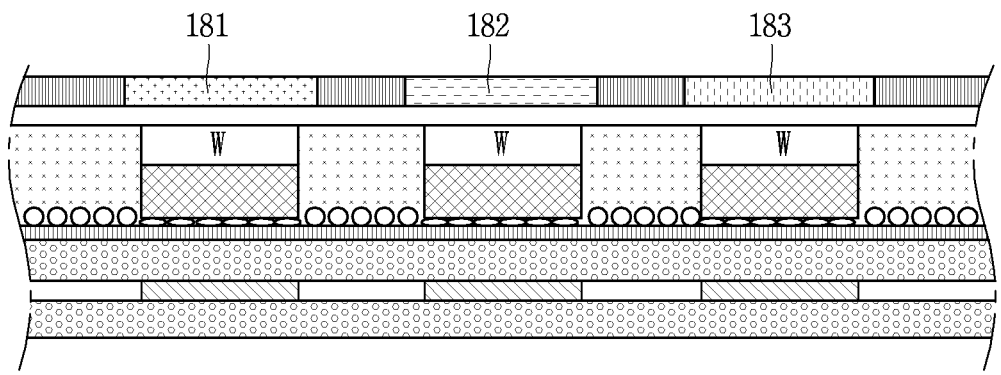

Referring to FIG. 5B, the semiconductor light-emitting element may have a white light-emitting element (W) provided with a yellow phosphor layer for each element. In this case, a red phosphor layer 181, a green phosphor layer 182 and blue phosphor layer 183 may be provided on the white light-emitting element (W) to implement a sub-pixel. Furthermore, a color filter repeated with red, green and blue on the white light-emitting element (W) may be used to implement a sub-pixel.

Figure 5C:
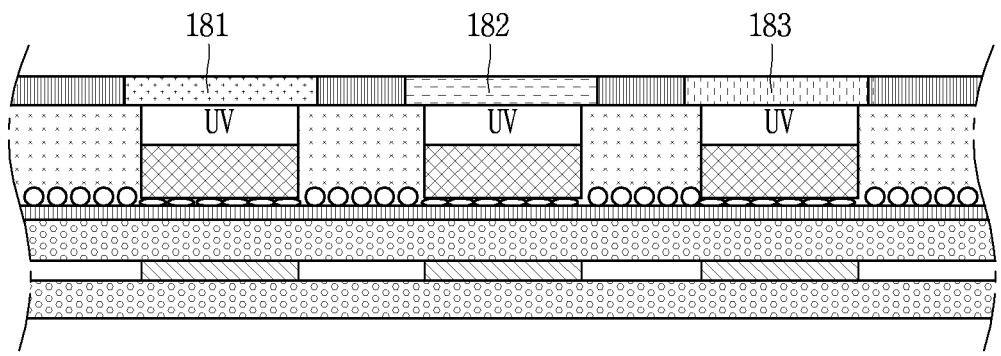

Referring to FIG. 5C, it may be possible to also have a structure in which a red phosphor layer 181, a green phosphor layer 182 and blue phosphor layer 183 may be provided on a ultra violet light-emitting element (UV). In this manner, the semiconductor light-emitting element can be used over the entire region up to ultra violet (UV) as well as visible light, and may be extended to a form of semiconductor light-emitting element in which ultra violet (UV) can be used as an excitation source.

Taking the present example into consideration again, the semiconductor light-emitting element 150 is placed on the conductive adhesive layer 130 to constitute a sub-pixel in the display device. The semiconductor light-emitting element 150 may have excellent luminance characteristics, and thus it may be possible to configure individual sub-pixels even with a small size thereof. The size of the individual semiconductor light-emitting element 150 may be less than 80 µm in the length of one side thereof, and formed with a rectangular or square shaped element. In case of a rectangular shaped element, the size thereof may be less than 20×80 µm.

Furthermore, even when a square shaped semiconductor light-emitting element 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light-emitting elements becomes sufficiently large. Accordingly, in this case, it may be possible to implement a flexible display device having a HD image quality.

A display device using the foregoing semiconductor light-emitting element will be manufactured by a new type of manufacturing method. Hereinafter, the manufacturing method will be described with reference to FIG. 6.

Figure 6:
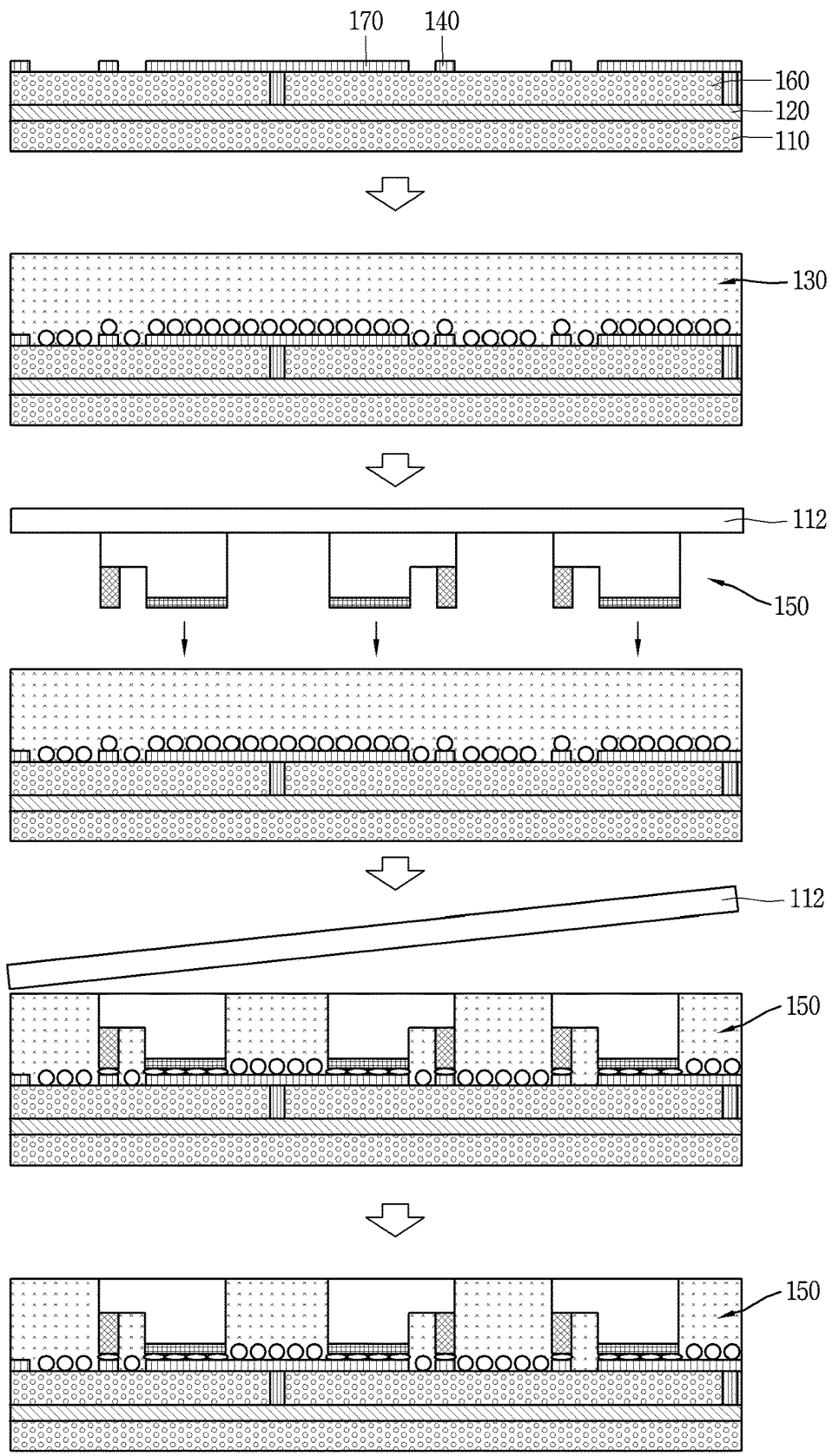
FIG. 6 is cross-sectional views showing a manufacturing method of a display device using a semiconductor light-emitting element according to the present disclosure.

FIG. 6 is cross-sectional views showing a manufacturing method of a display device using a semiconductor light-emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting elements 150 corresponding to the location of the auxiliary electrodes 170 and second electrodes 140 and constituting individual pixels is disposed such that the semiconductor light-emitting element 150 faces the auxiliary electrode 170 and second electrode 140.

In this case, the second substrate 112 as a growth substrate for growing the semiconductor light-emitting element 150 may be a sapphire substrate or silicon substrate.

The semiconductor light-emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting element 150 and the auxiliary electrode 170 and second electrode 140 may have conductivity due to the characteristics of an anisotropic conductive film having conductivity by thermal compression, thereby allowing the electrodes and semiconductor light-emitting element 150 to be electrically connected to each other. At this time, the semiconductor light-emitting element 150 may be inserted into the anisotropic conductive film, thereby forming a partition wall between the semiconductor light-emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting elements 150 to the outside. Silicon oxide (SiOx) or the like may be coated on the wiring substrate coupled to the semiconductor light-emitting element 150 to form a transparent insulating layer (not shown).

Furthermore, it may further include the process of forming a phosphor layer on one surface of the semiconductor light-emitting element 150. For example, the semiconductor light-emitting element 150 may be a blue semiconductor light-emitting element for emitting blue (B) light, and red or green phosphor for converting the blue (B) light into the color of the sub-pixel may form a layer on one surface of the blue semiconductor light-emitting element.

Meanwhile, it is difficult to implement a large-screen display device by assembling the semiconductor light-emitting element 1050 and electrodes described in FIG. 6. Accordingly, a manufacturing method in which semiconductor light-emitting elements are bonded to a substrate in a self-assembly method in which the substrate including semiconductor light-emitting elements and electrodes is immersed and assembled in a solution is being developed.

The manufacturing method or structure of a display device using the foregoing semiconductor light-emitting element may be modified in various forms. In addition, for another example of a method of manufacturing a display device using semiconductor light-emitting elements, a vertical semiconductor light-emitting element may also be applied to the display device described above. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
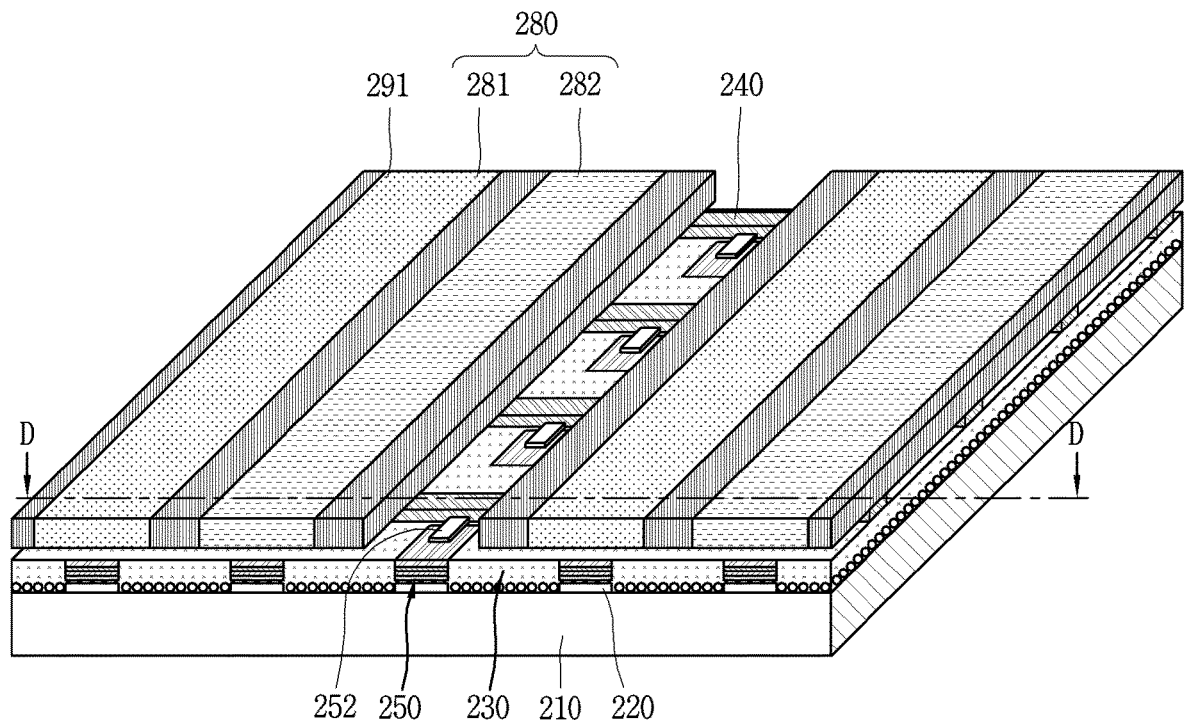
FIG. 7 is a perspective view showing a display device using a semiconductor light-emitting element according to another embodiment of the present disclosure.
Figure 8:
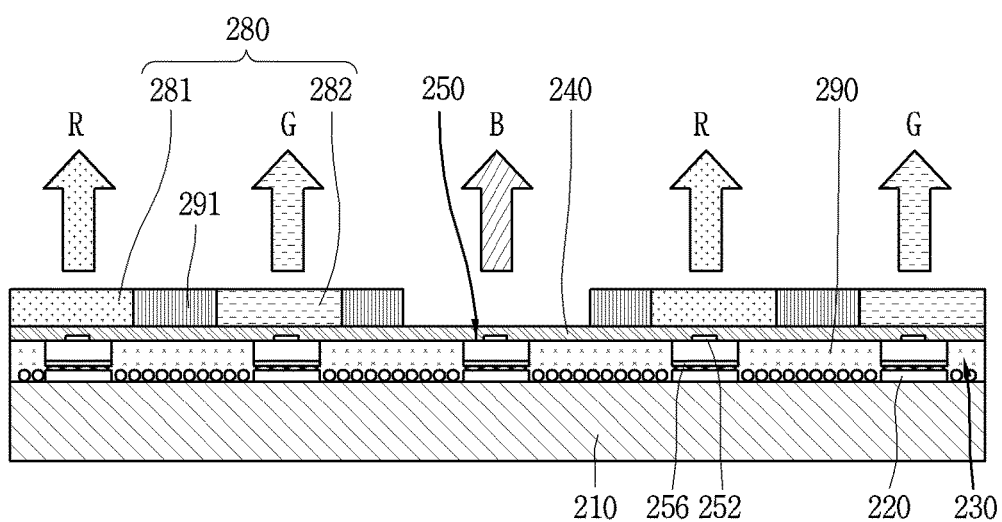
FIG. 8 is a cross-sectional view taken along line D-D in FIG. 7.
Figure 9:
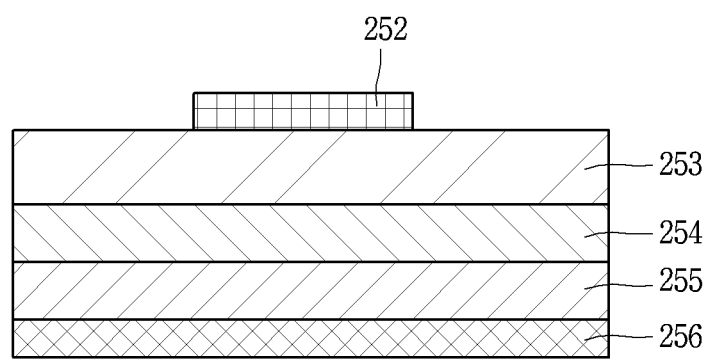
FIG. 9 is a conceptual view showing a vertical semiconductor light-emitting element in FIG. 8.

FIG. 7 is a perspective view illustrating a display device using a semiconductor light-emitting element according to another embodiment of the present disclosure. FIG. 8 is a cross-sectional view taken along line C-C in FIG. 7, and FIG. 9 is a conceptual view illustrating a vertical type semiconductor light-emitting element in FIG. 8.

According to the drawings, the display device may be display device using a passive matrix (PM) type of vertical semiconductor light-emitting element.

The display device may include a substrate 210, a first electrode 220, a conductive adhesive layer 230, a second electrode 240 and a plurality of semiconductor light-emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light-emitting element is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting element 250 thereto, the semiconductor light-emitting element 250 is electrically connected to the first electrode 220. At this time, the semiconductor light-emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting element 250 and the first electrode 220.

In this manner, the semiconductor light-emitting element 250 is placed on the conductive adhesive layer 230, thereby configuring a separate sub-pixel in the display device. The semiconductor light-emitting element 250 may have excellent luminance characteristics, and thus it may be possible to configure individual sub-pixels even with a small size thereof. The size of the individual semiconductor light-emitting element 250 may be less than 80 μm in the length of one side thereof, and formed with a rectangular or square shaped element. In case of a rectangular shaped element, the size thereof may be less than 20×80 μm.

The semiconductor light-emitting element 250 may be a vertical structure.

A plurality of second electrodes 240 disposed in a direction of crossing the length direction of the first electrode 220, and electrically connected to the vertical semiconductor light-emitting element 250 may be located between vertical semiconductor light-emitting elements.

Referring to FIG. 9, the vertical semiconductor light-emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting element 250, thereby providing a great advantage capable of reducing the chip size.

Referring again to FIG. 8, a phosphor layer 280 may be formed on one surface of the semiconductor light-emitting element 250. For example, the semiconductor light-emitting element 250 is a blue semiconductor light-emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting element 251 at a position implementing a red sub-pixel, and a green phosphor 282 capable of converting blue light into green (G) light may be deposited on the blue semiconductor light-emitting element 251 at a position implementing a green sub-pixel. Furthermore, only the blue semiconductor light-emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting element is applied.

Taking the present embodiment into consideration again, the second electrode 240 is located between the semiconductor light-emitting elements 250, and electrically connected to the semiconductor light-emitting elements 250. For example, the semiconductor light-emitting elements 250 may be disposed in a plurality of rows, and the second electrode 240 may be located between the rows of the semiconductor light-emitting elements 250.

Since a distance between the semiconductor light-emitting elements 250 constituting individual pixels is sufficiently large, the second electrode 240 may be located between the semiconductor light-emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light-emitting element 250 by a connecting electrode protruded from the second electrode 240. More specifically, the connecting electrode may be an n-type electrode of the semiconductor light-emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting element 250, the ITO material has a problem of bad adhesiveness with an n-type semiconductor. Accordingly, the second electrode 240 may be placed between the semiconductor light-emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting elements 250. In other words, the partition wall 290 may be disposed between the vertical semiconductor light-emitting elements 250 to isolate the semiconductor light-emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display device.

If the second electrode 240 is precisely located on the conductive adhesive layer 230 between the semiconductor light-emitting elements 250, the partition wall 290 may be located between the vertical semiconductor light-emitting element 250 and second electrode 240. Accordingly, individual sub-pixels may be configured even with a small size using the semiconductor light-emitting element 250, and a distance between the semiconductor light-emitting elements 250 may be relatively sufficiently large to place the second electrode 240 between the semiconductor light-emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light-emitting element 250 is located on the conductive adhesive layer 230, thereby constituting individual pixels on the display device. The semiconductor light-emitting element 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light-emitting element.

The display device of the present disclosure described above has a problem in that it is difficult to implement a large-screen display device. Accordingly, a manufacturing method in which semiconductor light-emitting elements are bonded to a substrate by self-assembly is being developed, but the yield is not high. This is because the self-assembly method is performed in an aqueous solution, and there is a limit that the loss of bonding metal that forms a bond between the substrate and the semiconductor light-emitting elements occurs due to an acidic aqueous solution in which self-assembly is performed.

In the present disclosure, a display device having a new structure capable of solving such a problem will be presented. Hereinafter, a display device having a structure having an improved assembly rate of semiconductor light-emitting elements even when repeated assembly is performed since a coating layer that coats a bonding metal is provided to prevent the loss of bonding metal by an aqueous solution in which self-assembly is performed will be described.

Figure 10:
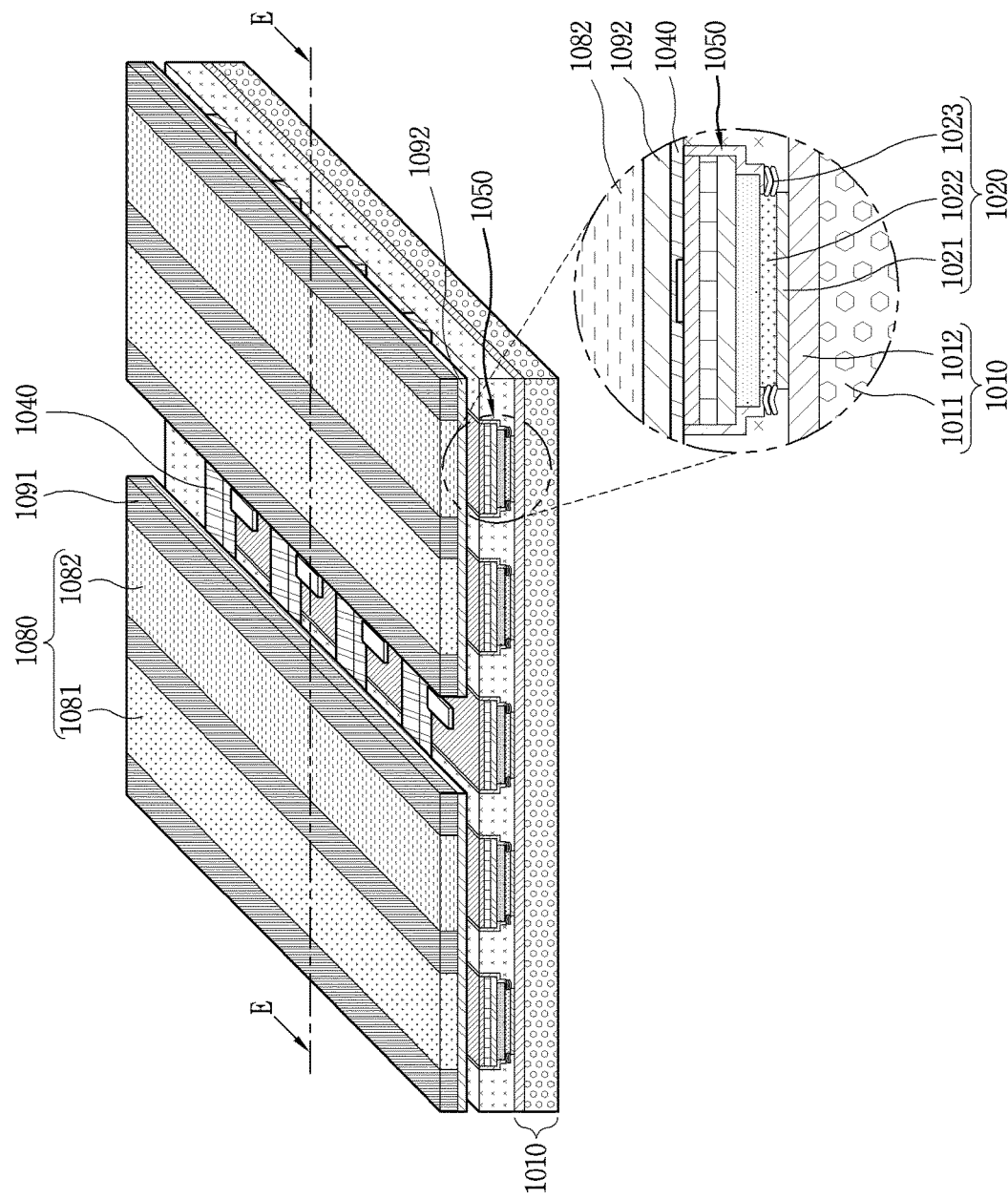
FIG. 10 is an enlarged view of portion "A" in FIG. 1 for explaining another embodiment of the present disclosure to which a display device having a new structure is applied.
Figure 11:
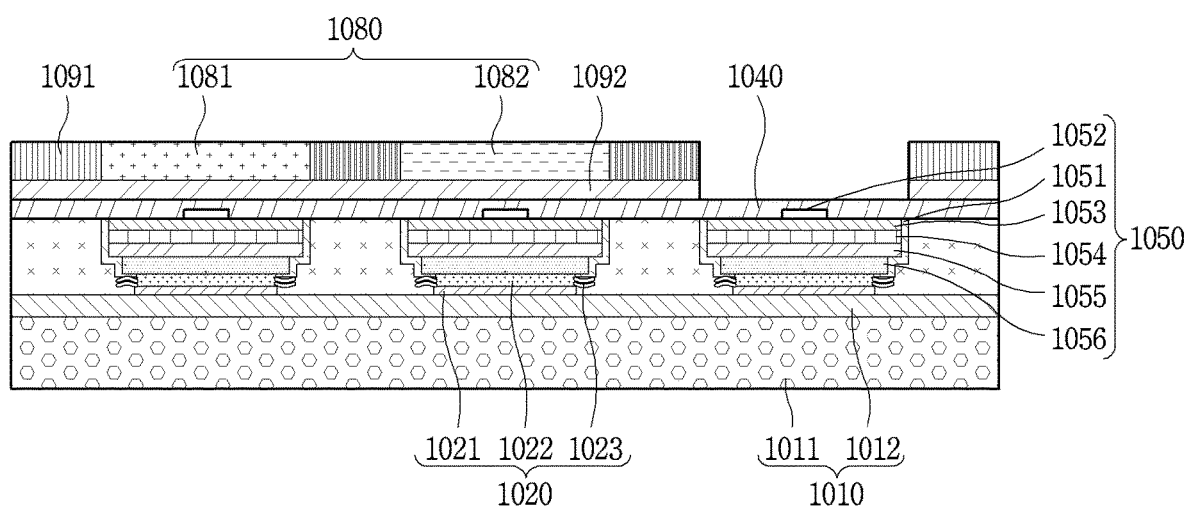
FIG. 11 is a cross-sectional view taken along line E-E in FIG. 10.

FIG. 10 is an enlarged view of portion "A" in FIG. 1 for explaining still another embodiment of the present disclosure of a display device having a new structure. FIG. 11 is a cross-sectional view taken along line E-E in FIG. 10.

According to the drawings in FIGS. 10 and 11, there is illustrated a display device 1000 using a passive matrix (PM) type semiconductor light-emitting element as a display device 1000 using a semiconductor light-emitting element. However, an example described below may also be applicable to an active matrix (AM) type semiconductor light-emitting element.

The display device 1000 may include a substrate 1010, a metal pad 1020, an insulating member 1030, a second electrode 1040, and a plurality of semiconductor light-emitting elements 1050.

The substrate 1010 may include a first substrate layer 1011 and a second substrate layer 1012. The first substrate layer 1011 may be a substrate formed of silicon or silicon oxide. Meanwhile, the first substrate layer 1011 may be selected from a group consisting of polyimide, fluoropolymer resin, polyester, polyacrylate, polyamide, and polycarbonate in order to implement a flexible display device. In addition, any one may be used if it is an insulating and flexible material.

Furthermore, the second substrate layer 1012 of the substrate 1010 is disposed under the semiconductor light-emitting element 1050 to perform the role of reflecting the light of the semiconductor light-emitting element 1050 traveling in a downward direction of the semiconductor light-emitting element 1050. Accordingly, the second substrate layer 1012 is formed of gold (Au), silver (Ag), platinum (Pt), aluminum (Al), palladium (Pd), and copper (Cu) to reflect light of the semiconductor light-emitting element 1050.

The metal pad 1020, as an electrode that electrically connects the semiconductor light-emitting element 1050 thereto, may perform the role of the aforementioned first electrode. The metal pad 1020 may include a metal layer 1021, a bonding metal 1022, and a coating layer 1023.

The metal layer 1021 may form an ohmic contact with the semiconductor light-emitting element 1050. Accordingly, the metal layer 1021 may include silver (Ag) or chromium (Cr) capable of forming an ohmic contact.

The bonding metal 1022 may be provided on the metal layer 1021 and may be electrically connected to the semiconductor light-emitting element 1050. The bonding metal 1022 may be formed of a solder paste. The solder paste may include at least one of copper (Cu), silver (Ag), indium (In), tin (Sn), and bismuth (Bi) to form a junction with the semiconductor light-emitting element 1050 through self-assembly in an acidic solution described later in FIG. 13. The enumeration for the bonding metal 1022 is exemplary only, and the present disclosure is not limited thereto.

The coating layer 1023 may be formed to surround the bonding metal 1022. The coating layer 1023 may be formed of an amphiphilic organic material. The amphiphilic organic material is a material having a hydrophilic portion and a hydrophobic portion at both ends of the molecule.

The amphiphilic organic material forming the coating layer 1023 is formed to surround the bonding metal 1022 by forming an electrostatic bond with the bonding metal 1022. In detail, the hydrophilic portion of the amphiphilic organic material may form an electrostatic bond with a surface of the bonding metal 1022 to form the coating layer 1023. In addition, a natural oxide layer is formed on the surface of the bonding metal 1022 to be modified into a hydrophilic surface, and accordingly, the hydrophilic portion of the amphiphilic organic material may be easily bonded to the natural oxide layer on the surface of the bonding metal 1022.

Moreover, the hydrophilic portion of the amphiphilic organic material may include at least one of a hydroxyl group (—OH), a carboxy group (—COOH), an amine group (—NH$_2$), a sulfonic acid group (—SO$_3$H), a phosphoric acid group (—OPO$_3$H$_2$) and a sulfonic acid salt (—OSO$_3$H). Meanwhile, the hydrophobic portion of the amphiphilic organic material may include at least one of hydrocarbon, halogenated alkyl, and an organosilicon compound having no affinity for water molecules.

In one embodiment, the amphiphilic organic material may be formed of oleic acid (C$_{18}$H$_{34}$O$_2$). Accordingly, the carboxy group of oleic acid is bonded to a natural oxide layer on the surface of the bonding metal 1022, and the hydrophobic group of oleic acid may be arranged toward a direction opposite to the surface of the bonding metal 1022.

The insulating member 1030 is disposed on the substrate as shown in FIG. 11 and may surround the semiconductor light-emitting element 1050. The insulating member 1030 as a flexible polymer material may include polydimethylsiloxane (PDMS) or polymethylphenylsiloxane (PMPS).

In addition, the insulating member 1030 may include transparent resin or a light reflective material. Accordingly, it may be possible to perform the role of improving the light efficiency while at the same time protecting the semiconductor light-emitting element 1050 from the external environment.

In detail, the light reflective material included in the insulating member 1030, as a filler for adjusting the refractive index, may include a light reflective material filler such as silicon dioxide (SiO$_2$), titanium dioxide (TiO$_2$), zinc oxide (ZnO$_2$) having a particle diameter of several nanometers.

On the other hand, the semiconductor light-emitting element 1050 includes a first conductive electrode 1056 and a second conductive electrode 1052, a first conductive semiconductor layer 1055 disposed with the first conductive electrode 1056, a second conductive semiconductor layer 1053 configured to overlap with the first conductive semiconductor layer 1055, and disposed with the second conductive electrode 1052, and an active layer 1054 disposed between the first conductive semiconductor layer 1055 and the second conductive semiconductor layer 1053.

The first conductive electrode 1056 and the second conductive electrode 1052 of the semiconductor light-emitting element 1050 may be electrically coupled to the metal pad 1020 and the second electrode 1040, respectively, in a corresponding manner.

More specifically, the first conductive electrode 1056 and the first conductive semiconductor layer 1055 may be a p-type electrode and a p-type semiconductor layer, respectively, and the second conductive electrode 1052 and the second conductive semiconductor layer 1053 may be an n-type electrode and an n-type semiconductor layer, respectively. However, the present disclosure is not limited thereto, and the first conductive type may be n-type and the second conductive type may be p-type.

Furthermore, the semiconductor light-emitting element 1050 may include a passivation layer 1051 formed to cover the lateral surfaces of the first conductive semiconductor layer 1055 and the second conductive semiconductor layer 1053. For example, the passivation layer 1051 may be formed to surround the lateral surfaces and the bottom surfaces of the first conductive semiconductor layer 1055 and the second conductive semiconductor layer 1053.

Specifically, the passivation layer 1051 covers the lateral surface of the semiconductor light-emitting element to stabilize the characteristics of the semiconductor light-emitting element 1050 and is formed of an insulating material. For an example, the passivation layer 1051 may be an insulating thin film made of a silicon compound or oxide. More specifically, the passivation layer 1051 may be formed of any one or more materials of AlxOy, SixOy, SixNy, SnxOy, TixOy, CrOx, and ZrOx.

Moreover, the display device 1000 may further include a phosphor layer 1080 formed on a surface of the plurality of semiconductor light-emitting elements 1050. For example, the semiconductor light-emitting element 1050 is a blue semiconductor light-emitting element that emits blue (B) light, and the phosphor layer 1080 performs the role of converting the blue (B) light into the color of a sub-pixel. The phosphor layer 1080 may be a red phosphor 1081 or a green phosphor 1082 constituting an individual pixel, and a black matrix 1091 is disposed between each phosphor layer in order to improve contrast. In this case, the red (R), green (G) and blue (B) sub-pixels may implement one pixel. In addition, a resin layer 1092 may be additionally disposed to improve light extraction efficiency and protect the semiconductor light-emitting element 1050.

Figure 12:
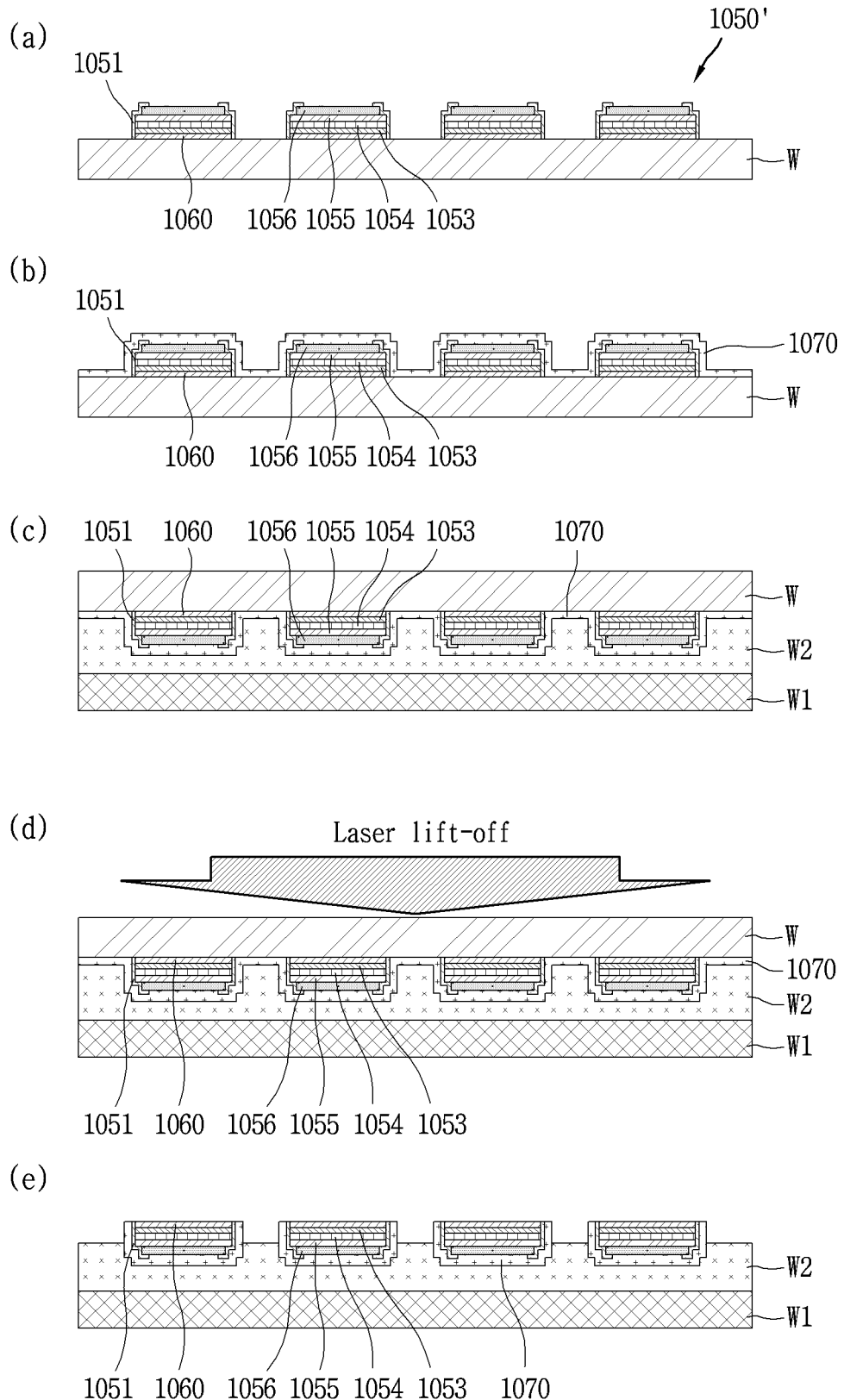
FIGS. 12 through 14 are conceptual views showing a method of manufacturing a display device according to the present disclosure.
Figure 14:
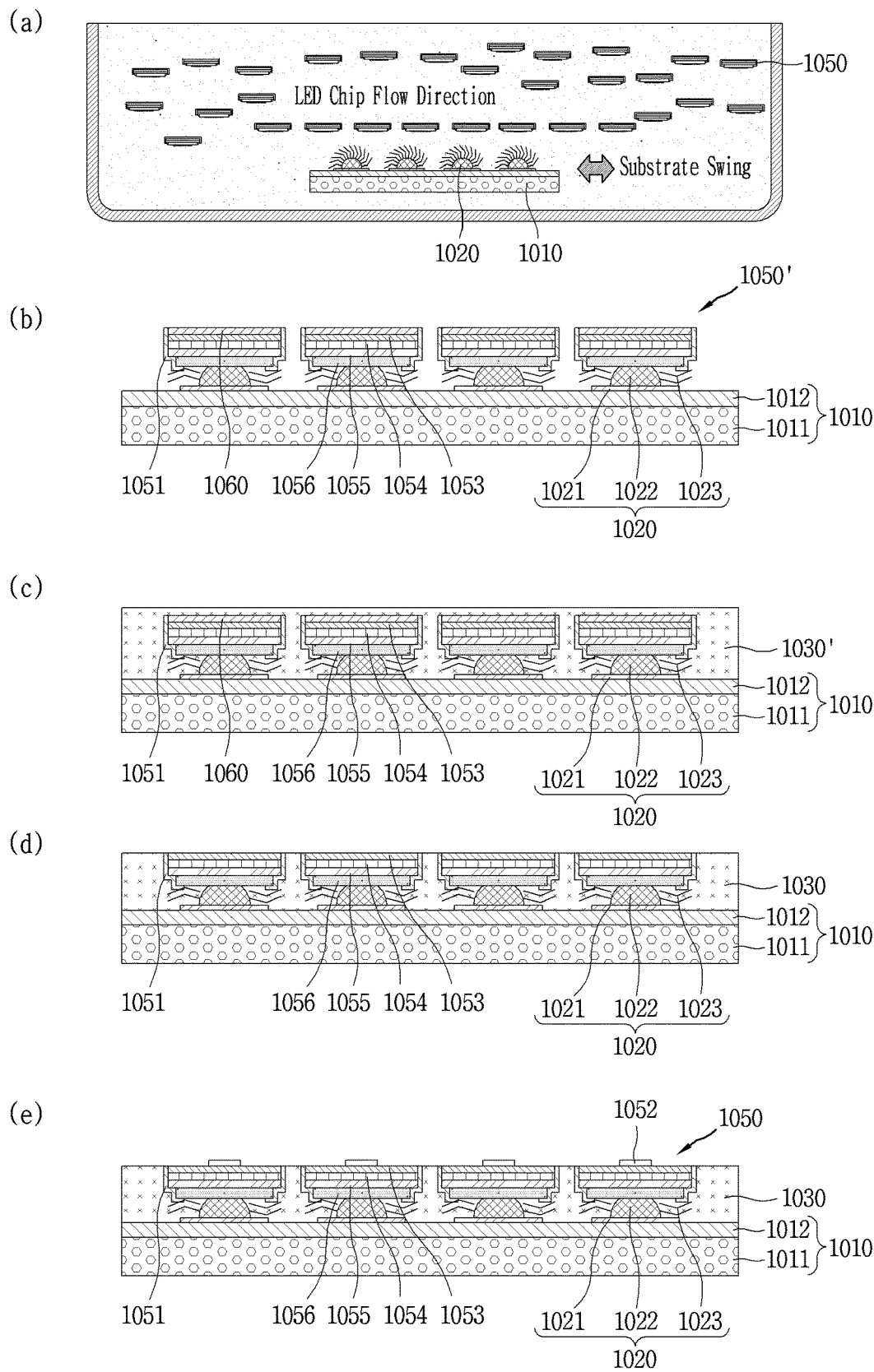

FIGS. 12 and 14 are conceptual views showing a method of manufacturing the display device 1000 according to the present disclosure.

Referring to FIG. 12, it shows that the semiconductor light-emitting element 1050' is grown on a growth substrate (W) and transferred to a laminated body of a first temporary substrate (W1) and a second temporary substrate (W2).

Referring to (a) of FIG. 1, an undoped semiconductor layer 1060, a first conductive semiconductor layer 1055, an active layer 1054, a second conductive semiconductor layer 1053, and a passivation layer 1051 are formed on the growth substrate (W) made of a sapphire substrate or a silicon substrate. Accordingly, the semiconductor light-emitting element 1050' may be formed on the growth substrate (W).

Referring to (b) of FIG. 12, a sacrificial layer 1070 that can be easily removed by a wet etching process is deposited on the surfaces of the semiconductor light-emitting element 1050' and the growth substrate (W). Accordingly, the sacrificial layer 1070 may be formed to surround the semiconductor light-emitting element 1050'.

Referring to (c) of FIG. 12, a semiconductor light-emitting element 1050' in which a sacrificial layer 1070 is deposited on a laminated body of the first temporary plate (W1) and the second temporary substrate (W2) is transferred by a lamination process. The first temporary plate (W1) may be formed of a material that does not undergo deformation during the lamination process. The first temporary plate (W1) may be selected from a group consisting of polyimid, fluororesin, polyester, polyacrylate, polyamide, and polycarbonate having a low coefficient of thermal expansion (CTE) and a high thermal resistance.

On the other hand, the second temporary substrate (W2) may include polydimethylsiloxane (PDMS) or polymethylphenylsiloxane (PMPS) as a flexible polymer material that can be bonded to the semiconductor light-emitting element (1050') and the growth substrate (W) through a lamination process.

Referring to (d) of FIG. 12, the growth substrate (W) and the semiconductor light-emitting element 1050' may be separated by a laser lift-off (LLO) method or a chemical lift-off (CLO) method. A laser beam may be preferably used for the separation of the growth substrate (W). Although the growth substrate (W) and the semiconductor light emitting element 1050' are separated by a laser beam, they are not separated from each other because the growth substrate (W) and the second temporary substrate (W2) are bonded by lamination.

Referring to (e) of FIG. 12, in order to separate the growth substrate (W), a delamination process is performed to separate the semiconductor light-emitting element 1050' from the growth substrate (W).

Figure 13:
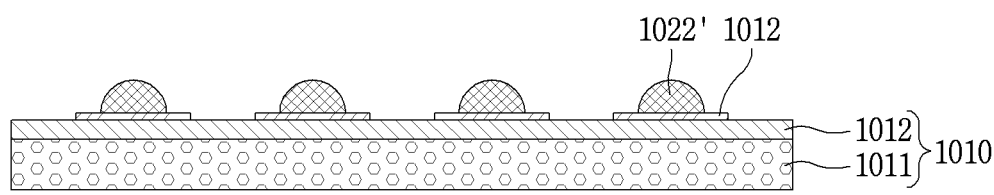
Figure 13:
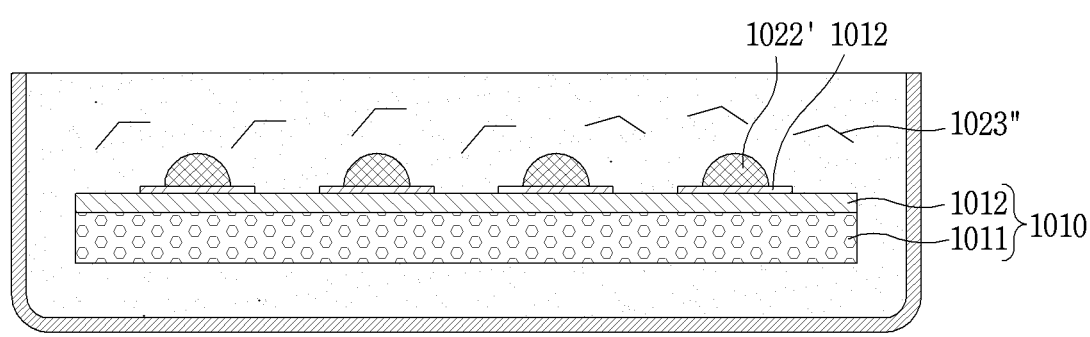
Figure 13:
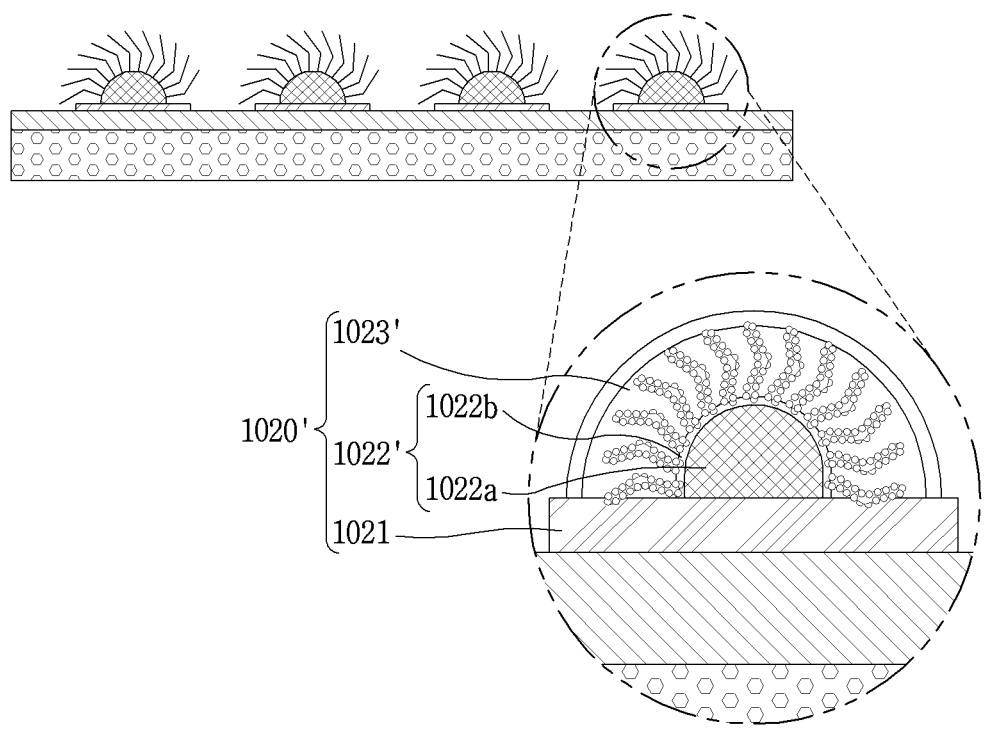

Referring to FIG. 13, it is shown that a metal pad 1020' is formed on the substrate 1010.

Referring to (a) of FIG. 13, a metal layer 1021 and a bonding metal 1022' may be disposed on the substrate 1010 including a first substrate layer 1011 and a second substrate layer 1012. The bonding metal 1022' may be formed of a solder paste. The solder paste may include at least one of copper (Cu), silver (Ag), indium (In), tin (Sn), and bismuth (Bi).

Referring to (b) of FIG. 13, the substrate 1010 on which the metal pad 1020' is formed is immersed in a solution containing an amphiphilic organic material 1023" for a predetermined period of time to form a coating layer formed of the amphiphilic organic material 1023" on a surface of the bonding metal 1022'. In detail, the substrate 1010 on which the metal pad is formed may be immersed in a solution of a predetermined concentration containing an amphiphilic organic material 1023". Accordingly, hydrophilic portions of the amphiphilic organic material 1023" may be self-aligned by forming an electrostatic bond with a surface of the bonding metal 1022'. In other words, the coating layer 1023' may be formed. The solution of the predetermined concentration may be formed in a concentration of 0.01 to 10 M.

Meanwhile, a natural oxide layer 1022b may be formed on the surface of the bonding metal 1022' and modified into a hydrophilic surface. Accordingly, the hydrophilic portions of the amphiphilic organic material 1023" may be easily bonded to a natural oxide layer 1022b on the surface of the bonding metal 1022'.

Referring to (c) of FIG. 13, subsequent to the process of (b) of FIG. 13, a residual amphiphilic organic material 1023" that does not form a bond with the bonding metal 1022' may be removed by washing with an organic solvent. Accordingly, a coating layer 1023' formed of an amphiphilic organic material 1023" may be formed on the surface of the bonding metal 1022'. In other words, the coating layer 1023' may be formed by combining the amphiphilic organic material 1023" with the natural oxide layer 1022b surrounding an internal bonding metal 1022a.

The formation of the coating layer 1023' may prevent the bonding metal 1022' from being lost from an acidic fluid used in a self-assembly process of the semiconductor light-emitting element 1050, which will be described later in FIG. 14. In general, metals such as indium (In) and tin (Sn) that may be included in the bonding metal 1022' have a problem that ionization is easily performed in an acidic fluid.

However, the metal pad 1020' surrounding the bonding metal 1022' is formed by a hydrophobic portion of the amphiphilic organic material 1023" forming the coating layer 1023' of the present disclosure to prevent an acidic fluid used in the self-assembly process from being in contact with the bonding metal 1022'. Accordingly, since the bonding metal 1022' is prevented from being lost during the self-assembly process in an acidic fluid to maintain the composition of the bonding metal 1022', an assembly rate of the semiconductor light-emitting element 1050 coupled to the substrate through an assembly repeated in a self-assembly manner may be improved, thereby increasing yield.

Referring to FIG. 14, it is shown a coupling between the substrate 1010 on which the metal pad 1020' is formed and the semiconductor light-emitting element 1050.

Referring to (a) of FIG. 14, the first temporary board (W1), the second temporary board (W2) and the semiconductor light-emitting element 1050' manufactured in (a) of FIG. 1 are immersed in a fluid-filled chamber. Accordingly, the sacrificial layer 1070, which can be easily removed by a wet etching process, may be removed to separate the semiconductor light-emitting element 1050' from the first temporary board (W1) and the second temporary board (W2).

Here, the substrate 1010 including the metal pad 1020' on which the coating layer 1023' manufactured in (c) of FIG. 13 is formed may be immersed in an acidic fluid to collide the semiconductor light-emitting element 1050' and the metal pad 1020' with each other. Accordingly, a coupling between the metal pad 1020' and the semiconductor light-emitting element 1050' may be formed. In addition, in order to increase a probability that the semiconductor light-emitting element 1050' and the metal pad 1020' are collided and combined with each other, the fluid may be heated or sonication may be additionally performed.

The combination of the semiconductor light-emitting element 1050' and the metal pad 1020' may allow the coating layer 1023' and the semiconductor light-emitting element 1050' to collide with each other in an acidic fluid to form the metal pad 1020 including the modified bonding metal 1022 and the coating layer 1023 as the coating layer 1023' is pushed to an outer edge of the bonding metal 1022' due to a surface tension of the coating layer 1023'.

Referring to (b) of FIG. 14, the semiconductor light-emitting element 1050' may be coupled to the substrate 1010 on which the metal pad 1020 is formed.

Referring to (c) of FIG. 14, an insulating member 1030' may be formed on the substrate 1010 to which the semiconductor light-emitting element 1050' is coupled to surround the semiconductor light-emitting element 1050'.

Referring to (d) of FIG. 14, an undoped semiconductor layer 1060 may be etched to expose the second conductive semiconductor layer 1053. In addition, an upper portion of the insulating member 1030' may be etched to form the insulating member 1030 having the etched upper portion.

Referring to (e) of FIG. 14, the second conductive electrode 1052 may be disposed on the second conductive semiconductor layer 1053 to form the semiconductor light-emitting element 1050. In addition, a resin layer (not shown) may be additionally applied to improve light extraction efficiency and protect the semiconductor light-emitting element 1050.

Furthermore, steps (b) and (c) of FIG. 13 and step (a) of FIG. 14 may be performed a plurality of times to form a coupling of the semiconductor light-emitting element 1050'. In other words, after forming the coating layer 1023' and coupling the semiconductor light-emitting element 1050' thereto, steps (b) and (c) of FIG. 13 may be performed again to form the coating layer 1023' again on a surface of the bonding metal 1022' to which the semiconductor light-emitting element 1050' is not coupled.

An embodiment of the present disclosure in which steps (b) and (c) of FIG. 13 and step (a) of FIG. 14 are performed a plural number of times is shown in Table 1 below.

In Comparative Example, step (a) of FIG. 14 in which there is no coating layer formed of an amphiphilic organic material, and the semiconductor light-emitting elements are bonded to a 5-inch substrate to which approximately 140,000 semiconductor light-emitting elements are bonded was repeated 5 times.

On the other hand, in Embodiment 1, a 5-inch substrate to which approximately 140,000 semiconductor light-emitting elements are bonded was immersed in a solution of 0.5 M concentration of oleic acid, which is an amphiphilic organic material to form a coating layer formed of oleic acid on a surface of the bonding metal, and step (a) in FIG. 14 was repeated 5 times.

In addition, in Embodiment 2, a 5-inch substrate to which approximately 140,000 semiconductor light-emitting elements are bonded was immersed in a solution of 0.5 M concentration of oleic acid, which is an amphiphilic organic material to form a coating layer formed of oleic acid on a surface of the bonding metal, and step (a) in FIG. 14 was repeated 3 times. Then, the substrate in which step (a) in FIG. 14 was repeated three times in a solution of 0.5 M concentration of oleic acid, which is an amphiphilic organic material, was immersed again to form a coating layer formed of oleic acid on a surface of the bonding metal again and then step (a) in FIG. 14 was repeated twice.

TABLE 1

| Item | Comparative Example | Embodiment 1 | Embodiment 2 |
|---|---|---|---|
| Assembly rate (%) | 99.0 | 99.947 | 99.986 |
| Bonding metal loss rate (%) | ~1 | 0.02 | 0.01 |

As shown in Table 1, it can be seen that an assembly rate of the semiconductor light-emitting elements in the Embodiments 1 and 2 having a coating layer formed of an amphiphilic organic material of the present disclosure is higher than that of the Comparative Example. In addition, it can be seen that the bonding metal loss rate of the Embodiments 1 and 2 is lower than that of the Comparative Example.

The configurations and methods according to the above-described embodiments will not be applicable in a limited way to the foregoing display device using a semiconductor light-emitting element, and all or part of each embodiment may be selectively combined and configured to make various modifications thereto.

What is claimed is:

1. A display device, comprising:
 a substrate having a plurality of metal pads; and
 a semiconductor light-emitting element electrically connected to the plurality of metal pads through self-assembly,
 wherein each metal pad comprises:
  a metal layer;
  a bonding metal provided on the metal layer, and electrically connected to the semiconductor light-emitting element; and
  a coating layer surrounding the bonding metal, and
 wherein the coating layer is formed of an amphiphilic organic material.

2. The display device of claim 1, wherein the bonding metal comprises at least one of copper (Cu), silver (Ag), indium (In), tin (Sn), and bismuth (Bi).

3. The display device of claim 1, wherein the coating layer is formed of oleic acid.

4. The display device of claim 1, wherein a hydrophilic portion of the amphiphilic organic material forms an electrostatic bond with a natural oxide layer of the bonding metal to form the coating layer.

5. A method of manufacturing a display device, the method comprising:
 coupling a semiconductor light-emitting element to a substrate on which a plurality of metal pads are formed through self-assembly in a fluid-filled chamber,
 wherein a metal pad among the plurality of metal pads is formed on the substrate by:
  forming a metal layer on the substrate to form ohmic contact with the semiconductor light-emitting element;
  forming a bonding metal electrically connected to a conductive electrode of the semiconductor light-emitting element on the substrate; and
  forming a coating layer surrounding the bonding metal,
 wherein in the forming of the coating layer surrounding the bonding metal,
  the coating layer surrounding the bonding metal is formed of an amphiphilic organic material, and
  the substrate on which the bonding metal is formed is immersed in a solution of a predetermined concentration containing the amphiphilic organic material to self-align the amphiphilic organic material on a surface of the bonding metal, and
 wherein a hydrophilic portion of the amphiphilic organic material forms an electrostatic bond with a natural oxide layer of the bonding metal to form the coating layer.

6. The method of claim 5, further comprising:
 growing the semiconductor light-emitting element on a growth substrate;
 separating the semiconductor light-emitting element from the growth substrate, and fixing the semiconductor light-emitting element to a temporary substrate;
 separating the semiconductor light-emitting element from the temporary substrate in the fluid-filled chamber; and
 forming a sacrificial layer to surround the semiconductor light-emitting element between growing the semiconductor light-emitting element on the growth substrate and separating the semiconductor light-emitting element therefrom,
 wherein the sacrificial layer is a layer removed by a wet etching process.

7. The method of claim 6, wherein in the separating the semiconductor light-emitting element,
 the sacrificial layer is wet etched in a fluid, and the semiconductor light-emitting element is separated from the temporary substrate.

8. The method of claim 5, wherein in the coupling of the semiconductor light-emitting element to the substrate on which the plurality of metal pads are formed, the metal pad on which the coating layer is formed and the semiconductor light-emitting element are allowed to collide with each other in a fluid so that the metal pad is coupled to the semiconductor light-emitting element as the coating layer is pushed to an outer edge of the bonding metal due to a surface tension of the coating layer.

9. The method of claim 5, wherein the forming the coating layer surrounding the bonding metal and the coupling the semiconductor light-emitting element to the substrate on which the plurality of the metal pads are formed are performed a plurality of times.

10. The method of claim 5, further comprising forming an insulation member on the substrate and the semiconductor light-emitting element.

11. The method of claim 10, wherein the coating layer is interposed between the bonding metal and the insulating member.

12. The display device of claim 1, wherein the coating layer surrounds an outer edge of the bonding metal.

13. The display device of claim 1, further comprising an insulating member disposed on the substrate to surround the semiconductor light-emitting element.

14. The display device of claim 13, wherein the coating layer is interposed between the bonding metal and the insulating member.

15. A display device, comprising:
a substrate having a plurality of metal pads; and
a plurality of semiconductor light-emitting elements electrically connected to the plurality of metal pads, respectively,
wherein each metal pad comprises:
   a bonding metal electrically connected to a respective semiconductor light-emitting element; and
   a coating layer on the bonding metal,
wherein the coating layer and the bonding metal are coplanar and disposed on the respective semiconductor light-emitting element, and
wherein the coating layer is formed of an amphiphilic organic material.

16. The display device of claim 15, wherein the coating layer is disposed at an outer edge of the bonding metal.

17. The display device of claim 15, further comprising an insulating member disposed on the substrate to surround the respective semiconductor light-emitting element.

18. The display device of claim 17, wherein the coating layer is interposed between the bonding metal and the insulating member.

* * * * *